(12) United States Patent
Cheng et al.

(10) Patent No.: US 9,899,359 B1
(45) Date of Patent: Feb. 20, 2018

(54) LIGHT EMITTING DIODE PACKAGE STRUCTURE, METHOD FOR MAKING THE SAME, AND FLAT PANEL LIGHT SOURCE HAVING THE SAME

(71) Applicant: ADVANCED OPTOELECTRONIC TECHNOLOGY, INC., Hsinchu, Hsien (TW)

(72) Inventors: Chin-Fu Cheng, Hsinchu Hsien (TW); Chih-Hsun Ke, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 15/627,560

(22) Filed: Jun. 20, 2017

(30) Foreign Application Priority Data

May 31, 2017 (CN) .......................... 2017 1 0399031

(51) Int. Cl.
  *H01L 33/20* (2010.01)
  *H01L 25/13* (2006.01)
  *H01L 33/60* (2010.01)
  *H01L 33/62* (2010.01)

(52) U.S. Cl.
  CPC .............. *H01L 25/13* (2013.01); *H01L 33/20* (2013.01); *H01L 33/60* (2013.01); *H01L 33/62* (2013.01); *H01L 2933/0033* (2013.01); *H01L 2933/0058* (2013.01); *H01L 2933/0066* (2013.01)

(58) Field of Classification Search
  CPC ......... H01L 33/20; H01L 33/60; H01L 33/62; H01L 2933/00; H01L 2933/0033; H01L 2933/0058; H01L 2933/0066
  USPC .......................................................... 257/88
  See application file for complete search history.

(56) References Cited

U.S. PATENT DOCUMENTS 8,089,089 B2 * 1/2012 Kuo ...................... H01L 21/561
                                                      257/98

* cited by examiner

*Primary Examiner* — Monica D Harrison
(74) *Attorney, Agent, or Firm* — ScienBiziP, P.C.

(57) ABSTRACT

A vertically shallow LED package structure includes at least one LED chip, a package layer, and a first cover layer. Each LED chip includes a first bottom surface. The package layer covers and wraps around each LED chip, and can absorb light emitted by each LED chip and emit light with a different preset wavelength. The package layer includes a second bottom surface facing the first bottom surface, a first side surface perpendicular to the second bottom surface, and a convex surface interconnecting the second bottom surface and the first side surface. The convex surface protrudes away from the LED chip. The convex surface can reflect the light with the preset wavelength towards the first side surface. The first cover layer covers the package layer and exposes the first side surface.

19 Claims, 9 Drawing Sheets

LIGHT EMITTING DIODE PACKAGE STRUCTURE, METHOD FOR MAKING THE SAME, AND FLAT PANEL LIGHT SOURCE HAVING THE SAME

FIELD

The subject matter herein generally relates to light emitting diodes (LEDs), and more particularly, to an LED package structure, a method for making the LED package structure, and a flat panel light source having the LED package structure.

BACKGROUND

Flat panel light sources comprise LEDs and light guide plates positioned adjacent to the LEDs. The light guide plate comprises a light incident surface facing the LEDs and a light emitting surface perpendicular to the light incident surface. When the LEDs emit light, the light guide plate can reflect the light towards the light emitting surface.

However, a portion of the light emitted by the LEDs may not enter the light guide plate, which may lower the light coupling efficiency of the flat panel light source. Thus, the thickness of the light guide plate may need to be increased. However, a thin-type flat panel light source cannot be obtained. Improvement in the art is preferred.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
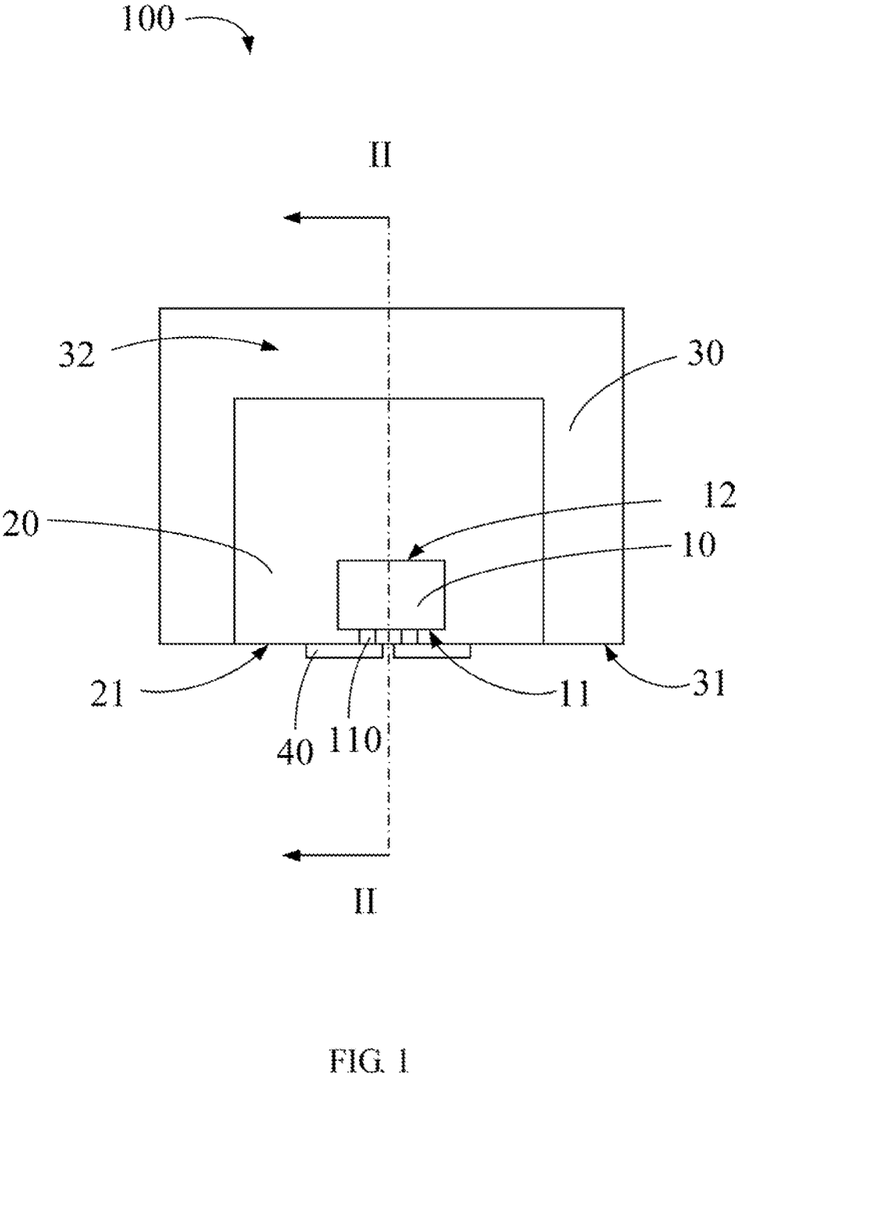
FIG. 1 is a diagram of an exemplary embodiment of an LED package structure.
Figure 2:
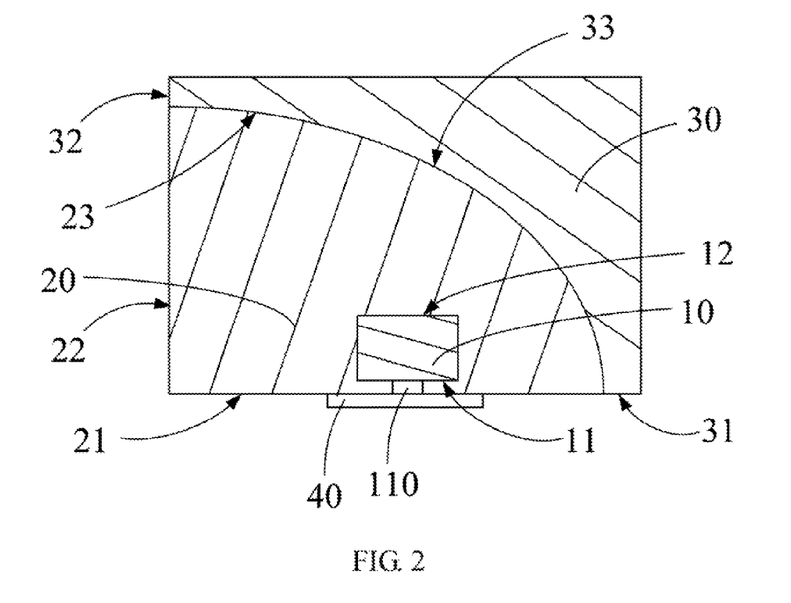
FIG. 2 is cross-sectional view taken along line II-II of FIG. 1.

FIGS. 1 and 2 illustrate an exemplary embodiment of an LED package structure 100 comprising at least one LED chip 10, a package layer 20, and a first cover layer 30. FIG. 1 illustrates the LED package structure 100 comprising only one LED chip 10 in the exemplary embodiment. In other exemplary embodiments, the LED package structure 100 comprises a number of LED chips 10 arranged in a column.

Each LED chip 10 comprises a first bottom surface 11. The first bottom surface 11 has a pair of solder bumps 110 having different electric conductivities. Each LED chip 10 further comprises a light emitting surface 12 facing away from the first bottom surface 11. The LED chip 10 emits light through the light emitting surface 12.

The package layer 20 covers and wraps around each LED chip 10. The package layer 20 absorbs the light emitted by the LED chip 10 and emits light with a different preset wavelength. Referring to FIGS. 1 and 2, the package layer 20 comprises a second bottom surface 21 facing the first bottom surface 11, a first side surface 22 perpendicular to the second bottom surface 21, and a convex surface 23 interconnecting the second bottom surface 21 and the first side surface 22. The convex surface 23 protrudes away from the LED chip 10. A surface area of the package layer 20 gradually decreases from the first side surface 22 towards a direction facing away from the first side surface 22. The top portions of the pair of solder bumps 110 facing away from the first bottom surface 11 are exposed from the second bottom surface 21. The convex surface 23 can reflect the light with the preset wavelength towards the first side surface 22. When the LED package structure 100 comprises a number of LED chips 10 arranged in a column (see FIG. 2, the column being along a direction perpendicular to the surface of the drawing), the first side surface 22 is parallel to the column of the LED chips. In at least one exemplary embodiment, the package layer 20 is a fluorescent layer.

Referring to FIG. 2, the first cover layer 30 covers the package layer 20 and exposes the first side surface 22, so that the light with the preset wavelength can be directly emitted out of the LED package structure 10 through the first side surface 22. That is, a large portion of the light emitted by the LED chip 10 can be emitted out of the LED package structure 10 through the first side surface 22. The first cover layer 30 comprises a third bottom surface 31, a second side surface 32 perpendicular to the third bottom surface 31, and a concave surface 33 interconnecting the third bottom surface 31 and the second side surface 32. The concave surface 33 matches the convex surface 23 in shape. In at least one exemplary embodiment, the third bottom surface 31 is coplanar with and surrounds the second bottom surface 21.

The second side surface 32 is coplanar with and surrounds the first side surface 22. The first cover layer 30 can be made of an opaque material such as silicon, epoxy, or combination thereof.

Referring to FIG. 1, the LED package structure 100 can further comprise at least one pair of extending electrodes 40. The number of pair(s) of extending electrodes 40 is equal to the number of LED chip(s) 10. Each pair of extending electrode 40 is positioned on the first bottom surface 11 of one LED chip 10, and each pair of extending electrode 40 is electrically connected to the pair of solder bumps 110 of the LED chip 10, respectively. The LED package structure 100 is electrically connected to external elements (not shown) through the pair of extending electrodes 40. In at least one exemplary embodiment, a sum of surface areas of each pair of extending electrodes 40 is greater than a sum of surface areas of each pair of solder bumps 110. The sum of surface areas of the pair of extending electrodes 40 is less than a surface area of the third bottom surface 31.

Figure 3:
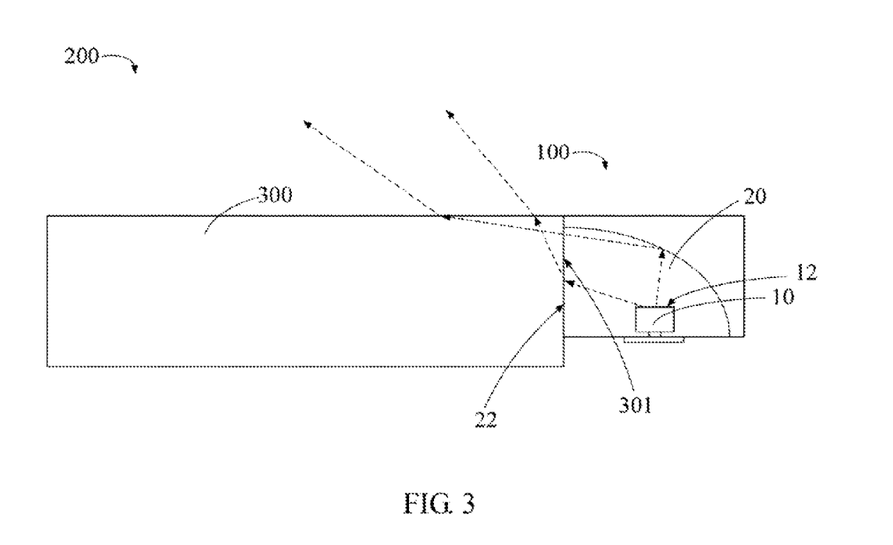
FIG. 3 is a diagram of a flat panel light source including the LED package structure of FIG. 1.

FIG. 3 illustrates a flat panel light source 200 comprising the LED package structure 100 and a light guide plate 300. The light guide plate 300 comprises a light incident surface 301 facing the first side surface 22. Thus, nearly all of the light from the first side surface 22 can directly enter the light guide plate 300 through the light incident surface 301, which can increase the light coupling efficiency of the flat panel light source 200 and decrease the thickness of the light guide plate 300. That is, a thin-type flat panel light source 200 can be obtained. In at least one exemplary embodiment, the incident surface 301 contacts the first side surface 22.

Figure 4:
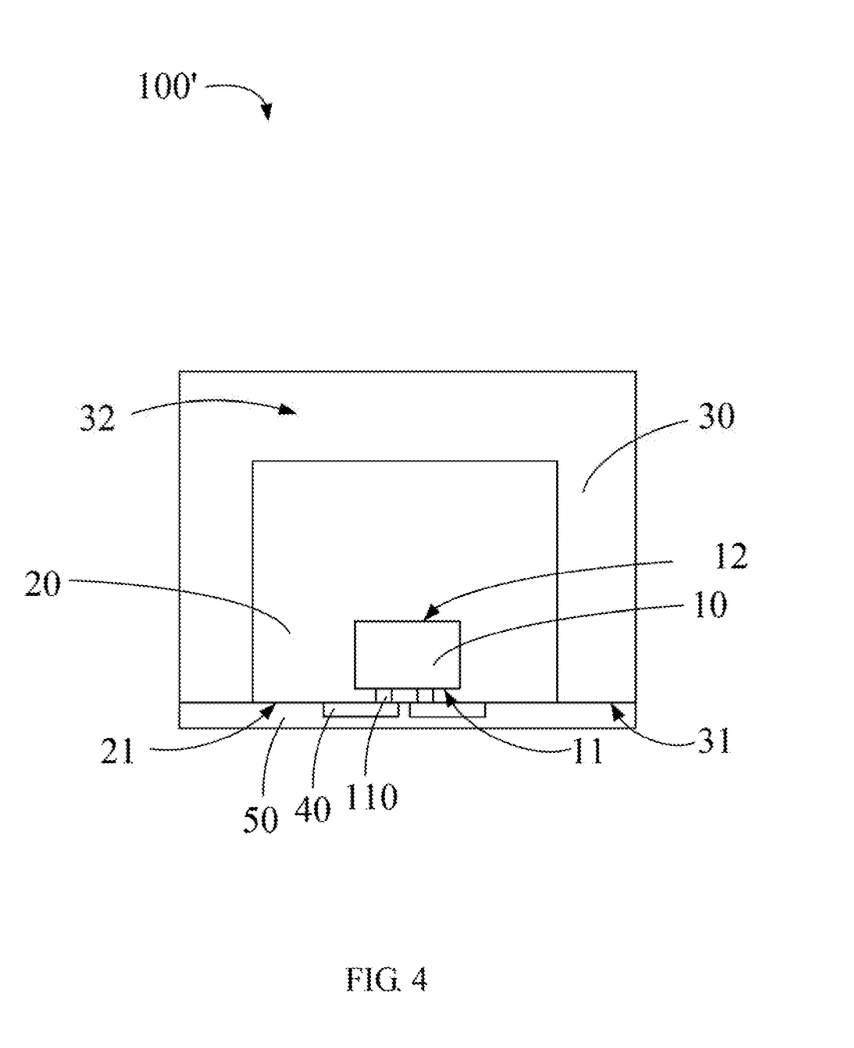
FIG. 4 is a diagram of another exemplary embodiment of an LED package structure.

FIG. 4 illustrates another exemplary embodiment of an LED package structure 100'. Different from the LED package structure 100, the LED package structure 100' further comprises a second cover layer 50. The second cover layer 50 covers the third bottom surface 31 and wraps around each pair of extending electrodes 40. The first cover layer 30 and the second cover layer 50 can be made of a same material.

Figure 5:
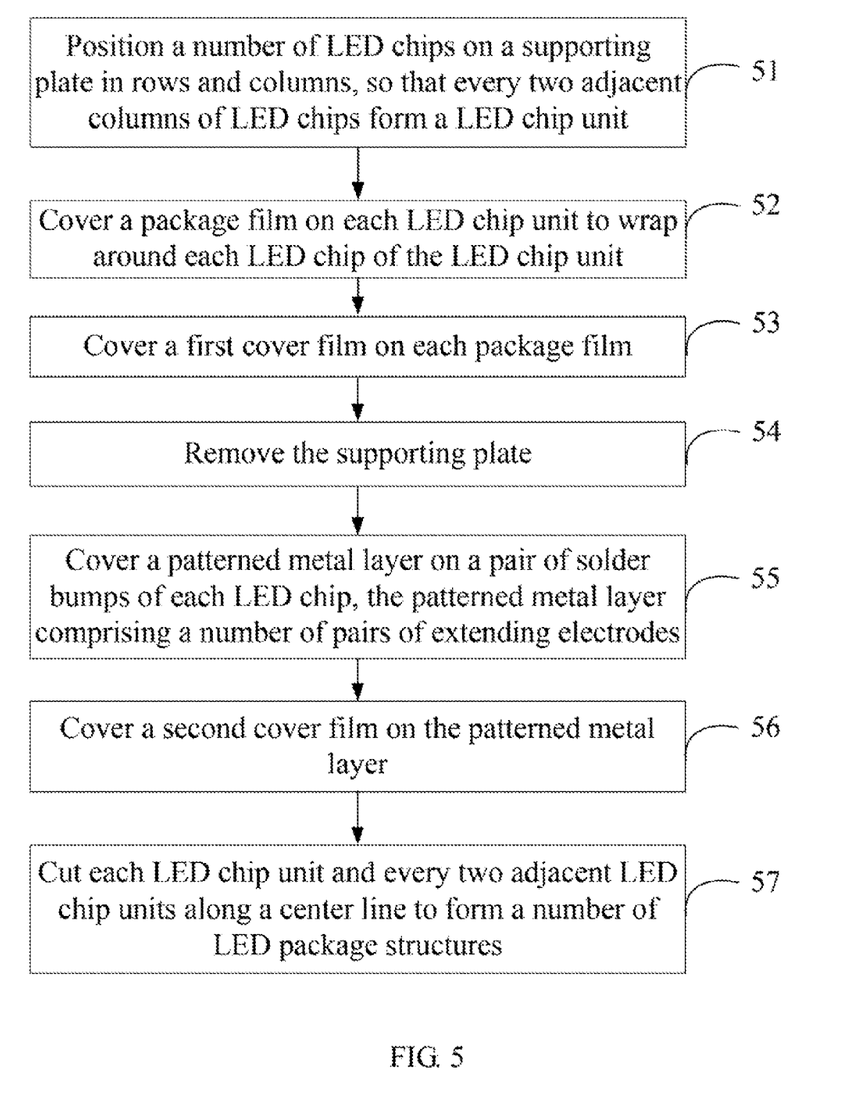
FIG. 5 is a flowchart of an exemplary embodiment of a method for making an LED package structure.

FIG. 5 illustrates a flowchart in accordance with an example embodiment. The exemplary method for making an LED package structure 100' is provided by way of example, as there are a variety of ways to carry out the method. The method described below can be carried out using the configurations illustrated in FIG. 4, for example, and various elements of these figures are referenced in explaining the example method. Each block shown in FIG. 5 represents one or more processes, methods, or subroutines, carried out in the exemplary method. Additionally, the illustrated order of blocks is by example only and the order of the blocks can change. The exemplary method can begin at block 51.

Figure 6:
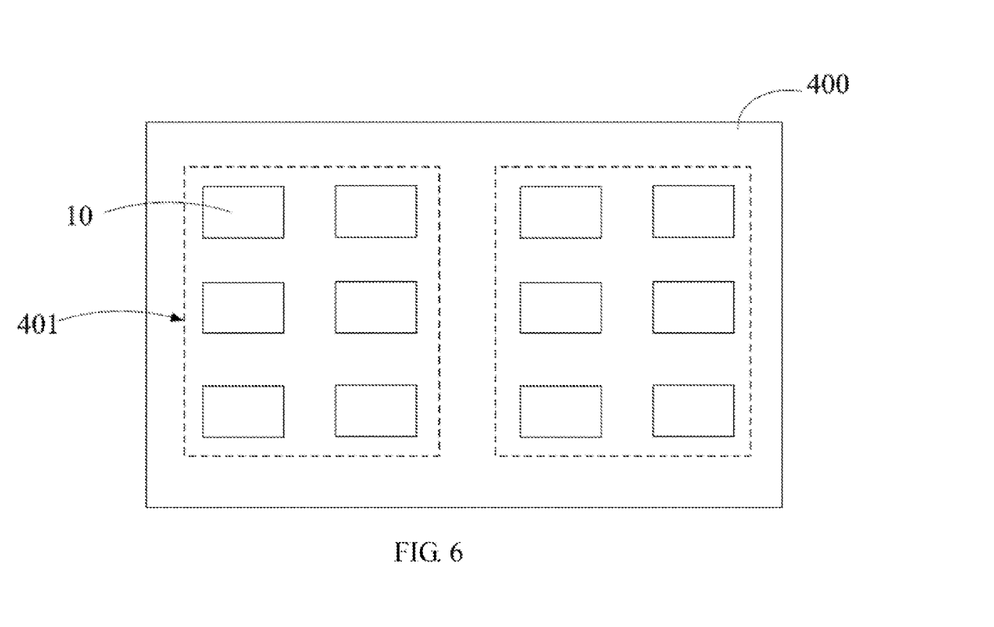
FIG. 6 is a diagram showing a number of LEDs positioned on a supporting plate to form a number of LED chip units.
Figure 7:
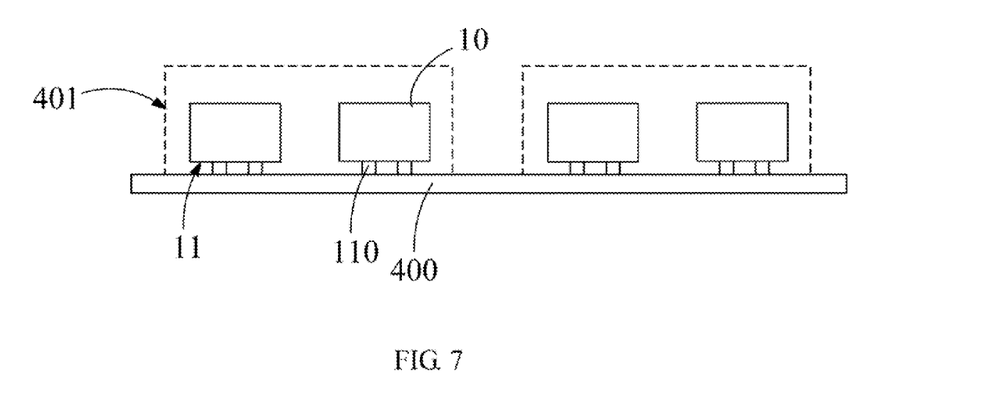
FIG. 7 is a diagram showing the LEDs positioned on the supporting plate similar to FIG. 6 from another angle.

At block 51, referring to FIGS. 6 and 7, a number of LED chips 10 are provided and positioned on a supporting plate 400 in rows and columns. Every two adjacent columns of LED chips 10 forms an LED chip unit 401. Each LED chip 10 comprises a bottom surface 11. The first bottom surface 11 has a pair of solder bumps 110 having different electric conductivities. The number of the LED chips 10 can be varied as needed.

Figure 8:
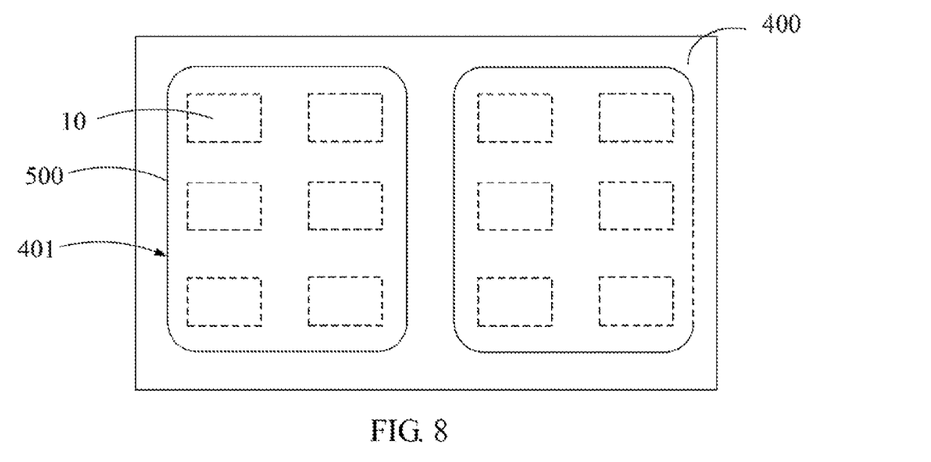
FIG. 8 is a diagram showing a package film covering the LED chip units of FIG. 6.
Figure 9:
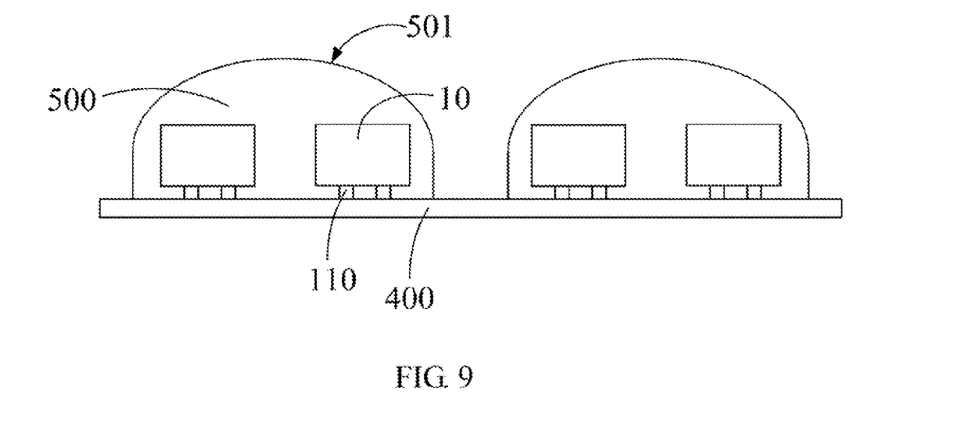
FIG. 9 is a diagram showing the package film covering the LED chip units similar to FIG. 8 from another angle.

At block 52, referring to FIGS. 8 and 9, a package film 500 covers each LED chip unit 401 to wrap around each LED chip 10 of the LED chip unit 401. Each package film 500 comprises a curved surface 501 protruding away from the LED chips 10.

Figure 10:
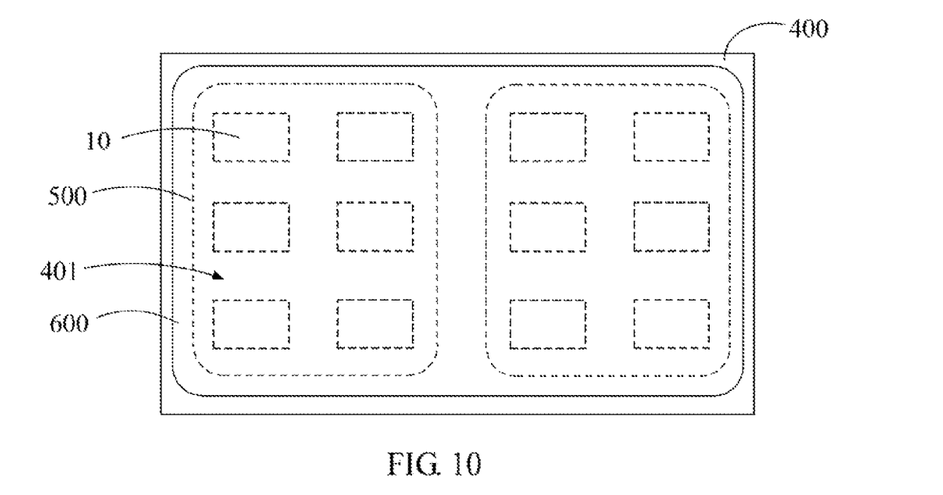
FIG. 10 is a diagram showing a first cover film covering the package film of FIG. 8.
Figure 11:
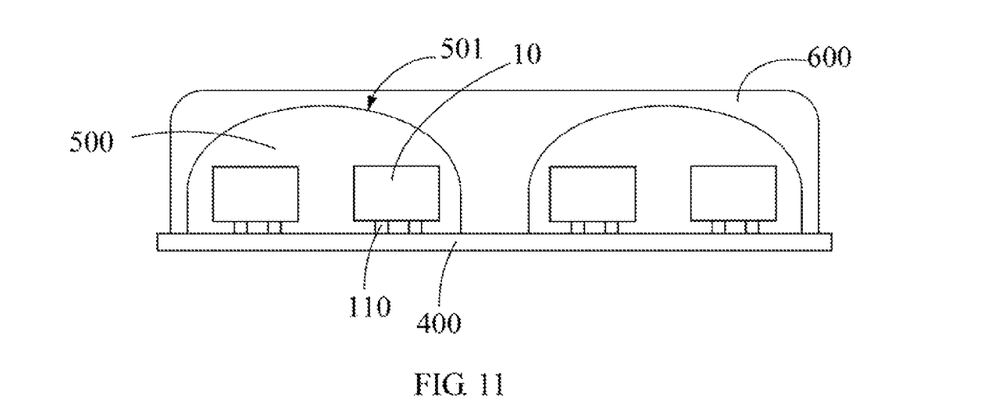
FIG. 11 is a diagram showing the first cover film covering the package film similar to FIG. 10 from another angle.

At block 53, referring to FIGS. 10 and 11, a first cover film 600 covers the curved surface 501 of each package film 500 and fills in gaps between two adjacent package films 500.

Figure 12:
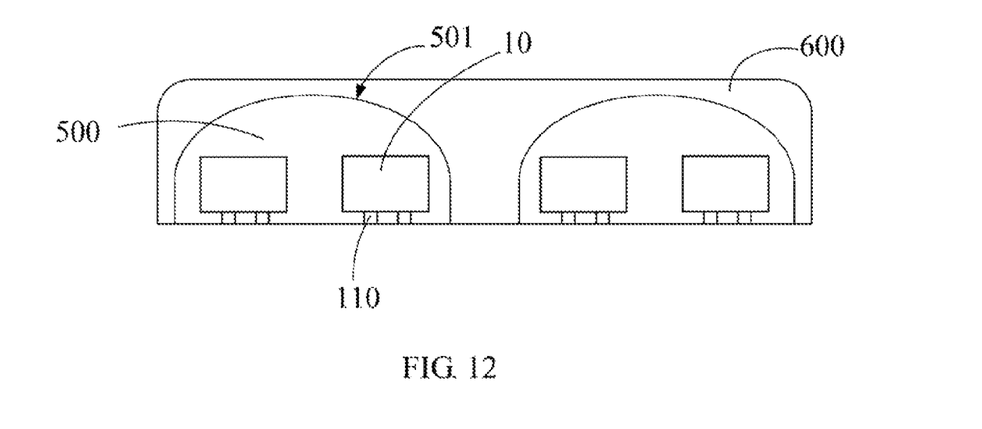
FIG. 12 is a diagram showing the supporting plate of FIG. 10 removed.

At block 54, referring to FIG. 12, the supporting plate 400 is removed to expose the pair of solder bumps 110 of each LED chip 10 from the package film 500.

Figure 13:
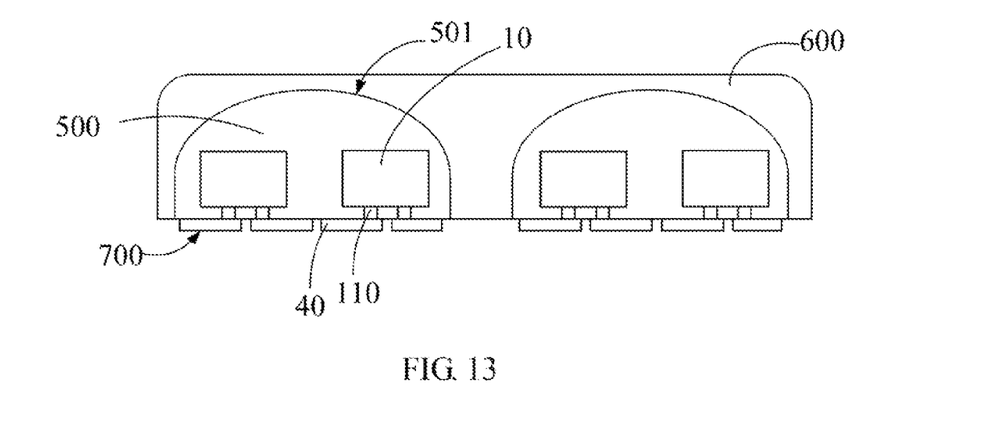
FIG. 13 is a diagram showing a patterned metal layer covering bumps of the LED chip units of FIG. 12.

At block 55, referring to FIG. 13, a patterned metal layer 700 covers the pair of solder bumps 110 of each LED chip 10. The patterned metal layer 700 comprises a number of pairs of extending electrodes 40 spaced from each other. Each pair of extending electrodes 40 is electrically connected to the pair of solder bumps 110 of one LED chip 10, respectively.

Figure 14:
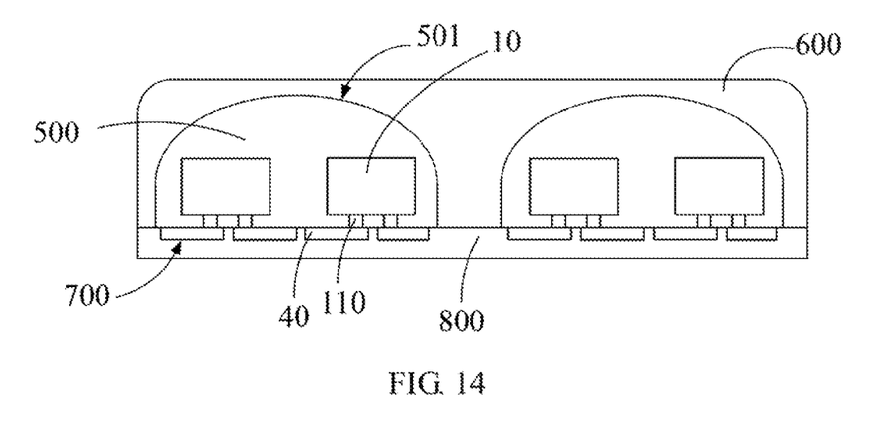
FIG. 14 is a diagram showing a second cover film covering the patterned metal layer of FIG. 13.

At block 56, referring to FIG. 14, a second cover film 800 covers the patterned metal layer 700 to wrap around each pair of extending electrodes 40.

Figure 15:
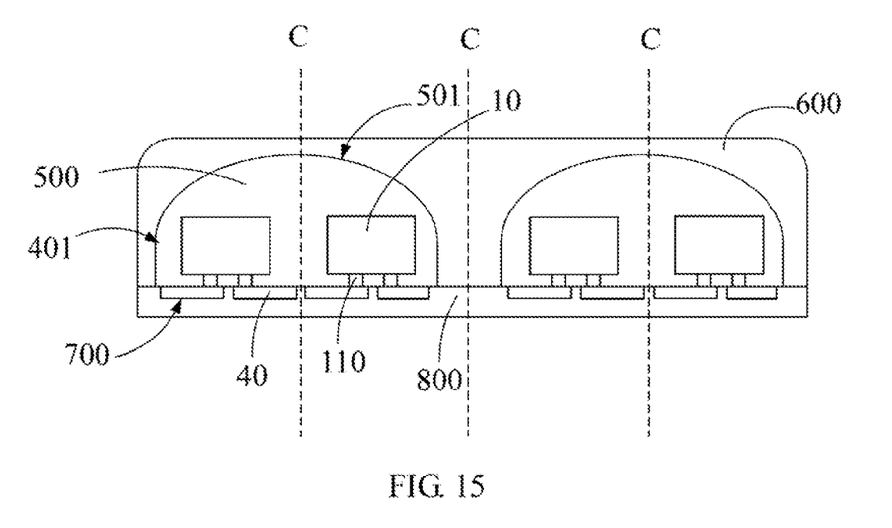
FIG. 15 is a diagram showing the LED chip units of FIG. 14 cut to form the LED package structure.

At block 57, referring to FIG. 15, each LED chip unit 401 and every two adjacent LED chip units 401 are cut along a center line (C dotted line) to form a number of LED package structures 100'. The cutting or center line "C" (C dotted line) is parallel to each column of LED chips 10 of each LED chip unit 401.

Each package film 500 is cut to form two package layers 20. Each package layer 20 is as shown in FIG. 3. After the cut, the curved surface 501 of the package film 500 are split into two convex surfaces 23 symmetrical to each other along the cutting line C. The cutting line "C" forms the first side surface 22 of the package layer 20. The first cover film 500 forms a number of first cover layers 30. The cutting line "C" forms the second side surface 32 of the first cover layers 30. The second cover film 800 forms a number of second cover layers 50.

In another exemplary embodiment, block 56 is omitted. In this case, a number of LED package structures 100 are formed after block 57.

Even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A light emitting diode (LED) package structure comprising:
   at least one LED chip, each LED chip having a first bottom surface;
   a package layer covering and wrapping around each LED chip, the package layer absorbing light emitted by each LED chip and emitting light with a different preset wavelength, the package layer having a second bottom surface facing the first bottom surface, a first side surface perpendicular to the second bottom surface, and a convex surface interconnecting the second bottom surface and the first side surface; wherein the convex surface protrudes away from the LED chip, and the convex surface reflects the light with the preset wavelength towards the first side surface; and
   a first cover layer covering the package layer and exposing the first side surface.

2. The LED package structure of claim 1, wherein the first cover layer comprises a third bottom surface, a second side surface perpendicular to the third bottom surface, and a concave surface interconnecting the third bottom surface and the second side surface; wherein the concave surface matches the convex surface in shape.

3. The LED package structure of claim 2, wherein the third bottom surface is coplanar with and surrounds the second bottom surface, and the second side surface is coplanar with and surrounds the first side surface.

4. The LED package structure of claim 3, wherein the first bottom surface comprises a pair of solder bumps having different electric conductivities, top portions of the pair of solder bumps facing away from the first bottom surface are exposed from the second bottom surface, the LED package structure further comprises at least one pair of extending electrodes, each pair of extending electrode is positioned on the first bottom surface of one LED chip, and each pair of extending electrode is electrically connected to the pair of solder bumps of the LED chip, respectively.

5. The LED package structure of claim 4, wherein a sum of surface areas of each pair of extending electrodes is greater than a sum of surface areas of each pair of solder bumps and the sum of surface areas of the pair of extending electrodes is less than a surface area of the third bottom surface.

6. The LED package structure of claim 4, further comprising a second cover film covering the third bottom surface and wrapping around each pair of extending electrodes.

7. The LED package structure of claim 1, comprising a plurality of LED chips, wherein the plurality of LED chips are arranged in a column, and the first side surface is parallel to the column of the plurality of LED chips.

8. The LED package structure of claim 1, wherein the package layer is a fluorescent layer.

9. A flat panel light source comprising:
a light emitting diode (LED) package structure comprising:
at least one LED chip, each LED chip having a first bottom surface;
a package layer covering and wrapping around each LED chip, the package layer absorbing light emitted by each LED chip and emitting light with a different preset wavelength, the package layer having a second bottom surface facing the first bottom surface, a first side surface perpendicular to the second bottom surface, and a convex surface interconnecting the second bottom surface and the first side surface; wherein the convex surface protrudes away from the LED chip, and the convex surface reflects the light with the preset wavelength towards the first side surface; and
a first cover layer covering the package layer and exposing the first side surface; and
a light guide plate having a light incident surface facing the first side surface.

10. The flat panel light source of claim 9, wherein the first cover layer comprises a third bottom surface, a second side surface perpendicular to the third bottom surface, and a concave surface interconnecting the third bottom surface and the second side surface; wherein the concave surface matches the convex surface in shape.

11. The flat panel light source of claim 10, wherein the third bottom surface is coplanar with and surrounds the second bottom surface, and the second side surface is coplanar with and surrounds the first side surface.

12. The flat panel light source of claim 11, wherein the first bottom surface comprises a pair of solder bumps having different electric conductivities, top portions of the pair of solder bumps facing away from the first bottom surface are exposed from the second bottom surface, the LED package structure further comprises at least one pair of extending electrodes, each pair of extending electrode is positioned on the first bottom surface of one LED chip, and each pair of extending electrode is electrically connected to the pair of solder bumps of the LED chip, respectively.

13. The flat panel light source of claim 12, wherein a sum of surface areas of each pair of extending electrodes is greater than a sum of surface areas of each pair of solder bumps and the sum of surface areas of the pair of extending electrodes is less than a surface area of the third bottom surface.

14. The flat panel light source of claim 12, further comprising a second cover film covering the third bottom surface and wrapping around each pair of extending electrodes.

15. The flat panel light source of claim 9, comprising a plurality of LED chips, wherein the plurality of LED chips are arranged in a column, and the first side surface is parallel to the column of the plurality of LED chips.

16. The flat panel light source of claim 9, wherein the package layer is a fluorescent layer.

17. A method for making a light emitting diode (LED) package structure comprising:
providing a plurality of LED chips and positioning the plurality of LED chips on a supporting plate in rows and columns, so that every two adjacent columns of the plurality of LED chips forms an LED chip unit;
covering a package film on each LED chip unit to wrap around each LED chip of the LED chip unit, each package film comprising a curved surface protruding away from the LED chip;
covering a first cover film on the curved surface of each package film, the first cover film further filling in gaps between two adjacent package films;
removing the supporting plate; and
cutting each LED chip unit and every two adjacent LED chip units along a center line to form a plurality of LED package structures, the cutting line being parallel to each column of LED chips of each LED chip unit.

18. The method of claim 17, wherein each of the plurality of LED chips comprises a first bottom surface, the first bottom surface comprises a pair of solder bumps having different electric conductivities, after the step of removing the supporting plate further comprises:
covering a patterned metal layer on the pair of solder bumps of each of the plurality of LED chips, the patterned metal layer comprising a plurality of pairs of extending electrodes spaced from each other, each of the plurality of pairs of the extending electrodes being electrically connected to one pair of the solder bumps of one of the plurality of the LED chips.

19. The method of claim 18, wherein after the step of covering a patterned metal layer on the pair of solder bumps of each of the plurality of LED chips further comprises:
covering a second cover film on the patterned metal layer to wrap around each of the plurality of pairs of extending electrodes.

* * * * *